US006345377B1

United States Patent
Kroeger et al.

(10) Patent No.: US 6,345,377 B1
(45) Date of Patent: Feb. 5, 2002

(54) DIGITAL AUDIO BROADCASTING METHOD USING PUNCTURABLE CONVOLUTIONAL CODE

(75) Inventors: Brian William Kroeger, Sykesville; Roy Ronald Stehlik, Columbia; Denise Maureen Cammarata, Owings Mills, all of MD (US)

(73) Assignee: Ibiquity Digital Corporation, Columbia, MD (US)

( * ) Notice: Subject to any disclaimer, the term of this patent is extended or adjusted under 35 U.S.C. 154(b) by 0 days.

(21) Appl. No.: 09/553,195

(22) Filed: Apr. 20, 2000

Related U.S. Application Data

(62) Division of application No. 09/049,140, filed on Mar. 27, 1998, now Pat. No. 6,108,810.

(51) Int. Cl.[7] .............................................. H03M 13/03
(52) U.S. Cl. ........................ 714/790; 375/308; 370/206
(58) Field of Search ................................ 714/790, 793, 714/825, 786, 788, 792, 795–796, 748; 375/260, 142, 308, 324, 340, 265, 280, 332, 341, 350, 267, 281, 284, 328, 338; 370/395, 206, 445, 501, 502, 527, 529; 455/13.2

(56) References Cited

U.S. PATENT DOCUMENTS

| | | | | |
|---|---|---|---|---|
| 4,099,121 A | * | 7/1978 | Fang | 375/267 |
| 5,056,117 A | * | 10/1991 | Gitlin et al. | 375/234 |
| 5,465,396 A | * | 11/1995 | Hunsinger et al. | 455/61 |
| 5,563,895 A | * | 10/1996 | Malkamaki et al. | 714/748 |
| 5,691,992 A | * | 11/1997 | Molnar et al. | 714/752 |
| 5,805,596 A | * | 9/1998 | Kranzler et al. | 370/445 |
| 5,825,807 A | * | 10/1998 | Kumar | 375/200 |
| 5,878,085 A | * | 3/1999 | McCallister et al. | 375/280 |
| 6,181,714 B1 | * | 6/1999 | Isaksson et al. | 370/491 |
| 5,926,500 A | * | 7/1999 | Odenwalder | 375/200 |
| 5,936,949 A | * | 8/1999 | Pasternak et al. | 370/328 |
| 5,949,796 A | * | 9/1999 | Kumar | 370/529 |

OTHER PUBLICATIONS

Central Control Facility for a Satellite Communication System; IBM Technical Disclosure Bulletin; NN670622; Jun. 1967, US;.*

Christman, A. (A rhombic antenna case study; IEEE, Dec. 1996).*

Kim, m–g ( On Systematic Punctured Convolutional Codes; IEEE, 1997).*

* cited by examiner

Primary Examiner—Albert Decady
Assistant Examiner—Guy J. Lamarre
(74) Attorney, Agent, or Firm—Robert P. Lenart; Pietragallo, Bosick & Gordon

(57) ABSTRACT

A broadcasting method comprising the steps of encoding program material using codes including a first set of bits and a second set of bits, the first set of bits contributing a greater coding gain to the codes than the second set of bits, modulating a plurality of orthogonal frequency division multiplexed carrier signals with the codes, whereby the first set of bits are carried by a first group of the carrier signals and the second set of bits are carried by a second group of the carrier signals, the first group of carrier signals being less susceptible to interference than the second group of carrier signals, broadcasting the carrier signals, receiving the carrier signals, estimating the interference to which the carrier signals in the second group have been subjected to determine if carrier signals in the second group have been corrupted, erasing bits carried by any of the carrier signals which have been determined to be corrupted, and decoding bits of the codes that have not been erased.

23 Claims, 4 Drawing Sheets

DIGITAL AUDIO BROADCASTING METHOD USING PUNCTURABLE CONVOLUTIONAL CODE

CROSS REFERENCE TO A RELATED PATENT APPLICATION

This is a divisional U.S. patent application Ser. No. 09/049,140, filed Mar. 27, 1998 now U.S. Pat. No. 6,108,810.

BACKGROUND OF THE INVENTION

This invention relates to radio broadcasting, and more particularly, to forward error correction in FM In-Band-On-Channel (IBOC) Digital Audio Broadcasting (DAB) and broadcasting systems utilizing such forward error correction.

Digital Audio Broadcasting is a medium for providing digital-quality audio, superior to existing analog broadcasting formats. Both AM and FM IBOC DAB can be transmitted in a hybrid format where the digitally modulated signal coexists with the currently broadcast analog signal. IBOC requires no new spectral allocations because each DAB signal is simultaneously transmitted within the same spectral mask of an existing channel allocation. IBOC promotes economy of spectrum while enabling broadcasters to supply digital quality audio to their present base of listeners. FM IBOC broadcasting systems using a hybrid modulation format have been the subject of several United States patents including patents no. 5,465,396; 5,315,583; 5,278,844 and 5,278,826. In addition a commonly assigned pending patent application for a "Method and System for Simultaneously Broadcasting and Receiving Digital and Analog Signals, by D. Kumar and B. Hunsinger, Serial No. 08/274,140, filed July 1994 discloses an FM IBOC DAB system now U.S. Pat. No. 5,956,624.

An orthogonal frequency division multiplex (OFDM) technique has been described for IBOC DAB. OFDM signals consist of orthogonally spaced carriers all modulated at a common symbol rate. The frequency spacing for rectangular pulse symbols (e.g., BPSK, QPSK, 8PSK or QAM) is equal to the symbol rate. For IBOC transmission of FM/DAB signals, a redundant set of OFDM sub-carriers is placed within about 100 kHz to 200 kHz on either side of a coexisting analog FM carrier. The DAB power (upper or lower sideband) is set to about −25 dB relative to the FM signal. The level and spectral occupancy of the DAB signal is set to limit interference to its FM host while providing adequate signal-to-noise ration (SNR) for the DAB sub-carriers. First adjacent signals spaced at +−200 kHz from the FM carrier can corrupt the DAB signal. However, at any particular location within a station's coverage area, it is unlikely that both first adjacents will significantly interfere with DAB. Therefore the upper and lower DAB sidebands carry the same redundant information such that only one sideband is needed to communicate the information. Inherent advantages of OFDM include robustness in the presence of multipath interference, and tolerance to non-gaussian short term noise or notches due to selective fading.

Forward error correction (FEC) and interleaving improve the reliability of the transmitted digital information over a corrupted channel. See for example, S. Kallel, "Complementary Punctured Convolution (CPC) Codes and Their Applications," IEEE Trans. Comm., Vol. 43, No. 6, pp. 2005–2009, June, 1995. Complementary Pair Convolution (CPC) FEC code techniques were developed for Automatic Repeat Request (ARQ) schemes where retransmissions were coded using complementary codes instead of simply retransmitting the same coded sequence. CPC codes can be constructed according to previously published puncturing techniques, e. g. Y. Yasuda, K. Kashiki, Y. Hirata, "High-Rate Punctured Convolutional Codes for Soft Decision Viterbi Decoding," IEEE Trans. Comm., Vol. 32, #3, March 1984; and J. Hagenauer, "Rate-Compatible Punctured Convolutional Codes (RCPC Codes) and Their Applications," IEEE Trans. Comm., Vol. 36, No. 4, pp. 389–400, April, 1988.

It is known that the periodic puncturing of bits from a convolutional code using Viterbi decoding is an effective means of creating higher rate convolutional codes. Rate compatible punctured convolutional (RCPC) codes have been conceived as a mechanism to adjust coding gain and bit energy as a function of channel capacity in a practical efficient manner, see the above Hagenauer reference or M. Kim, "On Systematic Punctured Convolutional Codes," IEEE Trans. Comm., Vol 45, No. 2, pp. 133–139, February 1997. This is useful in a point-to-point (non-broadcast) automatic repeat request (ARQ) system where an intended receiver assesses its signal to noise power ratio (Eb/No) and communicates its desire to the transmitter (via a return path) to increase or decrease energy per bit (Eb) and coding gain. The transmitter responds by adjusting its code rate R. This is accomplished with a punctured convolutional code where the transmission of all the bits typically employs an "industry standard" K=7, R=½ rate code, for example. It is assumed in this non-punctured case that the maximum Eb and coding gain is achieved. To improve spectral and/or power efficiency, the transmitter may elect to eliminate (puncture at the receiver's request, for example) the transmission of some of the coded bits, resulting in a higher rate code. This puncturing has the effect of lowering the effective Eb and coding gain relative to the original unpunctured code; however, this punctured code may still be sufficient to successfully communicate the information over the channel in a more efficient manner.

For best performance at a given code rate, a particular pattern of bits in the coded sequence is punctured. Unfortunately, the puncture pattern for higher rate codes does not include all the bits punctured for lower rate codes. Haganauer showed that the puncture patterns for his RCPC codes can include all punctures for lower rate codes with little loss compared to the optimal, but rate-incompatible, puncture patterns. Therefore the code rate can be increased from the original R=½ code simply by puncturing more of the puncturable bits of the same pattern. The higher rate codes are a subset of the bits of the lower rate codes.

The interference environment in VHF FM-band IBOC DAB channel is generally such that a DAB channel can be dichotomized into the following two subsets of subchannels: (a) a reliable part composed of regions of spectrum relatively free of interference from other stations'signals, characterized as being thermal or background noise limited, with multipath fading as an impairment; and (b) an unreliable part composed of regions of spectrum with intermittent intervals of heavy interference which corrupts the bits transmitted during those intervals, but is at other times (or for most geographical locations) similar to the reliable part described above. AM band IBOC DAB can be similarly characterized.

The prior art utilizes one of two fundamental strategies to transmit data in this environment: (1) simply do not utilize the unreliable part of the channel, thus those times during which the unreliable part is clear and usable are essentially wasted; or (2) utilize a sufficiently low rate code (and appropriately increased coded bit rate) to guarantee the required bit error rate (BER), and spread the increased bandwidth across both the reliable and unreliable parts of the spectrum evenly. This is done by uniform allocation of bits to OFDM carriers in an OFDM system, or increasing the raw bit rate of a single carrier system. This utilizes the unreliable part of the channel, but also incurs a BER penalty (possibly catastrophic) when severe interference occurs in the unreliable part of the channel. Depending on the interference, the second alternative may or may not be better than the first.

SUMMARY OF THE INVENTION

This invention addresses non-uniform interference through special coding and error handling to achieve more robust performance. The broadcasting method of the invention encodes program material using convolutional codes having non-puncturable bits and puncturable bits and modulates orthogonal frequency division multiplexed carrier signals with the convolutional codes. The non-puncturable bits are carried by a first group of the carriers and the puncturable bits are carried by a second group of the carriers, where he first group of carrier signals is less susceptible to interference than the second group of carrier signals. The carrier signals are then broadcast to receivers which determine if the carriers in the second group have been corrupted and erase puncturable bits carried by any of the carriers which have been determined to be corrupted. This produces punctured codes which are subsequently decoded to recover the program material.

The invention also encompasses transmitters and receivers which operate in accordance with the method of the invention. This invention provides an FEC coding technique that results in an improved bit error rate in the interference environment of an in-band-on-channel digital audio broadcasting system using orthogonal frequency division multiplexing. This mitigates the effects of interference from non-uniform interference in orthogonal frequency division multiplex broadcast systems.

DESCRIPTION OF THE PREFERRED EMBODIMENTS

Figure 1:
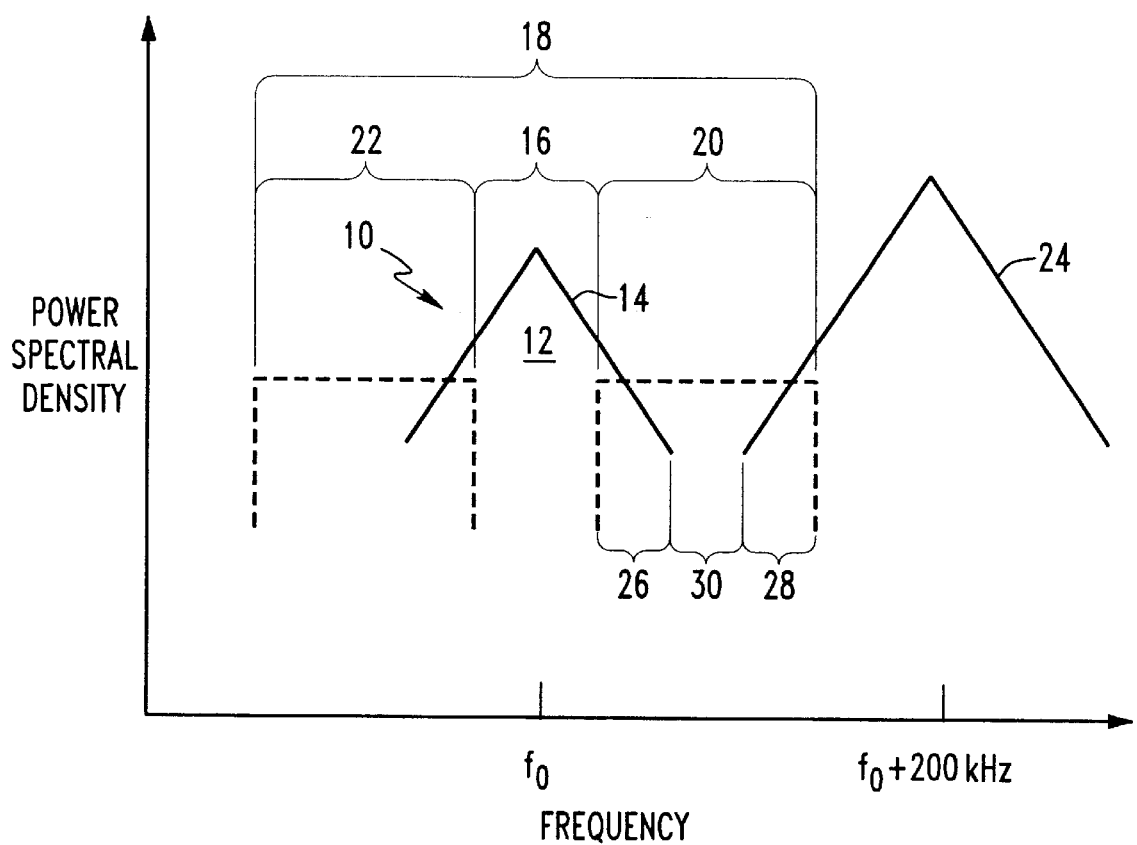
FIG. 1 is a schematic representation of the frequency spectrum of a host FM radio station broadcasting a DAB signal, with a first adjacent channel interferer.

The particular application of the preferred embodiment is for an In-Band On-Channel (IBOC) Digital Audio Broadcast (DAB) system where the outer OFDM sub-carriers furthest from the host FM carrier are sometimes subjected to destructive interference from the first adjacent and, possibly, the second adjacent channels. An illustration (not to scale) of the interference environment in a typical FM-band DAB scenario is shown in FIG. 1. FIG. 1 is a schematic representation of the frequency allocations (spectral placement) and relative power spectral density of the signal components for a hybrid FM IBOC DAB signal 10 which can utilize the present invention. The hybrid format includes the conventional FM stereo analog signal 12 having a power spectral density represented by the triangular shape 14 generally positioned in a central, or central frequency band, 16 portion of an FM-band channel 18. The Power Spectral Density (PSD) of a typical analog FM broadcast signal is nearly triangular with a slope of about −0.35 dB/kHz from the center frequency. A plurality of digitally modulated evenly spaced sub-carriers are positioned on either side of the analog FM signal, in an upper sideband 20 and a lower sideband 22, and are transmitted concurrently with the analog FM signal.

Signals from an adjacent FM channel 24 (i.e. the first adjacent FM signals), if present, would be centered at a spacing of 200 kHz from the center of the channel of interest. The in-band and first adjacent FM station carriers spectrally overlap the DAB channel, on the average, as their respective FM carriers sweep into and out of the DAB channel. This potential spectral overlap can result in the corruption of orthogonal frequency division multiplexed carriers which are located in the portion of the spectrum subject to the overlap. It is therefore apparent that the carriers lying near the ends of the upper sideband (in regions 26 and 28) are more susceptible to interference than those carriers lying near the center of the upper sideband (in region 30). The lower sideband would be subject to similar spectral overlap from the analog FM signal and the first adjacent FM signal on the other side of the channel of interest. Even the carriers lying within the interfered with regions could be made use of to improve the overall channel. In the hybrid system the total DAB power in the OFDM modulated sub-carriers in each sideband is set to about −25 dB relative to its host analog FM power.

The method of this invention employs a puncturable code and segregates the puncturable bits from the non-puncturable bits by putting the puncturable bits in the unreliable part of the channel. Puncturable codes are codes which employ bits, called puncturable bits, which, if erased, still permit recovery of the encoded data but with reduced error correctability compared to the original unpunctured code. The other bits, the ones which cannot be erased without substantial loss of coding gain, are called non-puncturable bits.

The puncturable bits are segregated from the non-puncturable bits by putting the puncturable bits in the unreliable part of the channel. Thus, when those bits get erased at the receiver, the performance of the overall channel is no worse than that of the reliable part of the channel by itself. But when they do not get erased, they can contribute to reducing the BER of the reliable part of the channel, improving its performance above that of the reliable part of the channel alone. In effect, this scheme dynamically allows clear periods of time in the unreliable part of the channel to be utilized in improving the BER performance of the overall channel, without being penalized with increased BER during interfered periods.

The technique described here allows the receiver to adaptively erase the soft symbols from particular OFDM carriers after the receiver has determined that the interference is sufficiently high to corrupt them. The particular FEC coding technique employed here exploits the ability to puncture or erase particular bits without excessive loss in coding gain.

The RCPC code technique of the above referenced paper by Hagenauer can be modified for application in an OFDM broadcast channel where the interference over the subchannels is not uniform, but predictable through estimation of non-uniform (nonwhite) interference or noise at any individual receiver. In this case the transmitter broadcasts all the coded bits (unpunctured). However the convolutionally encoded bits are arranged such that the possible puncturable bits will be transmitted on OFDM sub-carriers which would be most vulnerable to corruption. The non-puncturable encoded bits would be transmitted on the generally most reliable sub-carriers. Any particular receiver would assess its individual interference situation, particularly at the most vulnerable sub-carriers. If the receiver estimates sufficiently high interference to these subcarriers, then it would decide to erase the bits from these corrupted sub-carriers before decoding. The erasure consists of setting the soft-decision magnitudes of the erased bits to zero. Since the erasures are performed on the puncturable bits, the same effect as puncturing is achieved, but without the involvement of the transmitter. The selective erasure at the receiver of corrupted bits using a priori interference assessment information can significantly improve performance. OFDM transmission is unique in this respect where knowledge through estimation of non-uniform (nonwhite) interference or noise can be used to adaptively improve FEC decoder performance.

Further improvements or variations on this concept are possible. Some improvement in performance may be achievable through appropriate "weighting" of the puncturable bits instead of erasing to zero magnitude. This is possible in the present invention for the broadcast system compared to prior art non-broadcast systems where the bits are punctured at the transmitter. Ideally the appropriate weights on the soft bits coming from each subcarrier should be in proportion to the signal-to-noise ratio (SNR) for each subcarrier (assuming additive white gaussian noise, AWGN). However, estimation errors in a dynamic non-gaussian interference environment may reduce the potential effectiveness of this technique. Flexibility on bit usage is increased since the "broadcaster" may wish to use the puncturable bits for some kind of in-band signalling. In this case, some of the subcarriers carrying puncturable bits would be replaced with other data. This modification in format must also be broadcast to all the receivers (e.g. via a mode control bit within the message format) so that the receivers would puncture these bits upon decoding. Obviously this option would reduce the robustness of the resulting punctured data, but the broadcaster must consider this trade-off.

A special type of puncturable code includes some systematic codes. Systematic codes include the input data sequence as part of the output sequence, plus additional parity bits. Clearly, with systematic codes, all of the parity bits could be erased and the encoded data would have a bit error rate (BER) no worse than employing no code at all. But when the parity bits are not all punctured, the overall code has coding gain which results in a BER performance better than employing no code at all.

Although it is well known that nonsystematic codes outperform systematic codes for low rates (e.g. R=½), it has been shown that high rate systematic codes appear to perform better than high rate nonsystematic punctured convolutional codes (see the above cited paper by Kim). Systematic codes are characterized by having one output being a replica of the information sequence input. A systematic feedback encoder can be constructed from a nonsystematic feedforward encoder with identical distance properties (i.e. the same error correcting performance) of the nonsystematic feedforward encoder where the feedback is implemented with a binary polynomial division operation.

Figure 2:
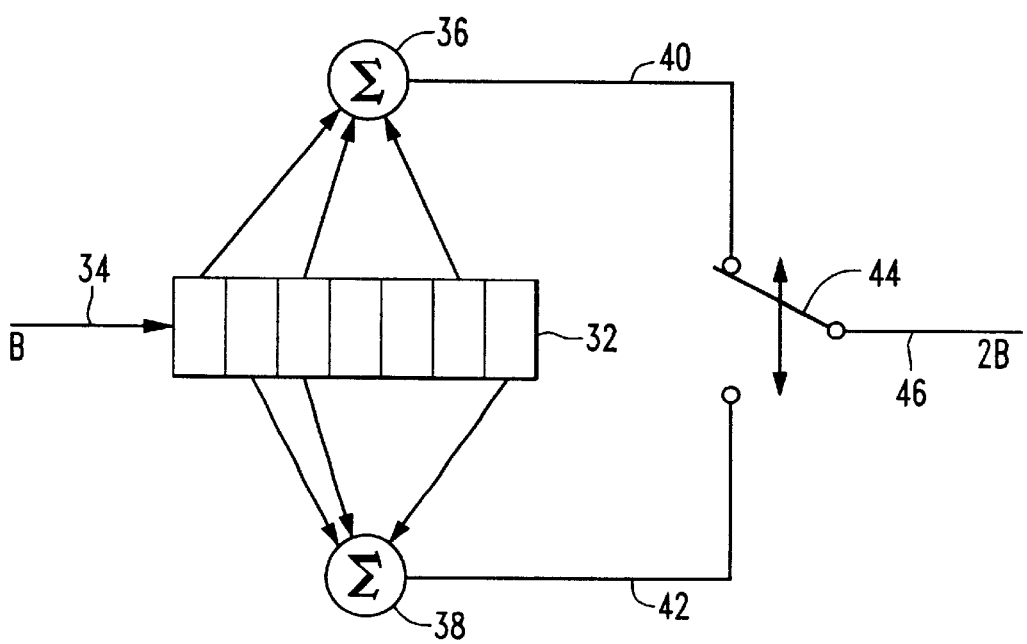
FIG. 2 is a schematic representation of a K=7, R=½ convolutional encoder.

A schematic representation of a rate ½ convolutional encoder is presented in FIG. 2. Shift register 32 receives input data bits on line 34. These input data bits are received at a rate B and are representative of program material to be transmitted. Such program material may include, for example, audio information representative of talk or music signals, and/or data. Taps are used to direct the bits of information in the shift register to modulo 2 adders 36 or 38. The taps chosen are for illustration only. A seven stage shift register with appropriate tapoff points would be used for a K=7, R=½ code. The output of modulo 2 adder 36 on line 40 contains puncturable coded bits and the output of modulo 2 adder 38 on line 42 contains non-puncturable bits. A switch 44 cycles at a rate 2B for a rate ½ code. This produces the coded output bits on line 46 at a bit rate of 2B.

Figure 3:
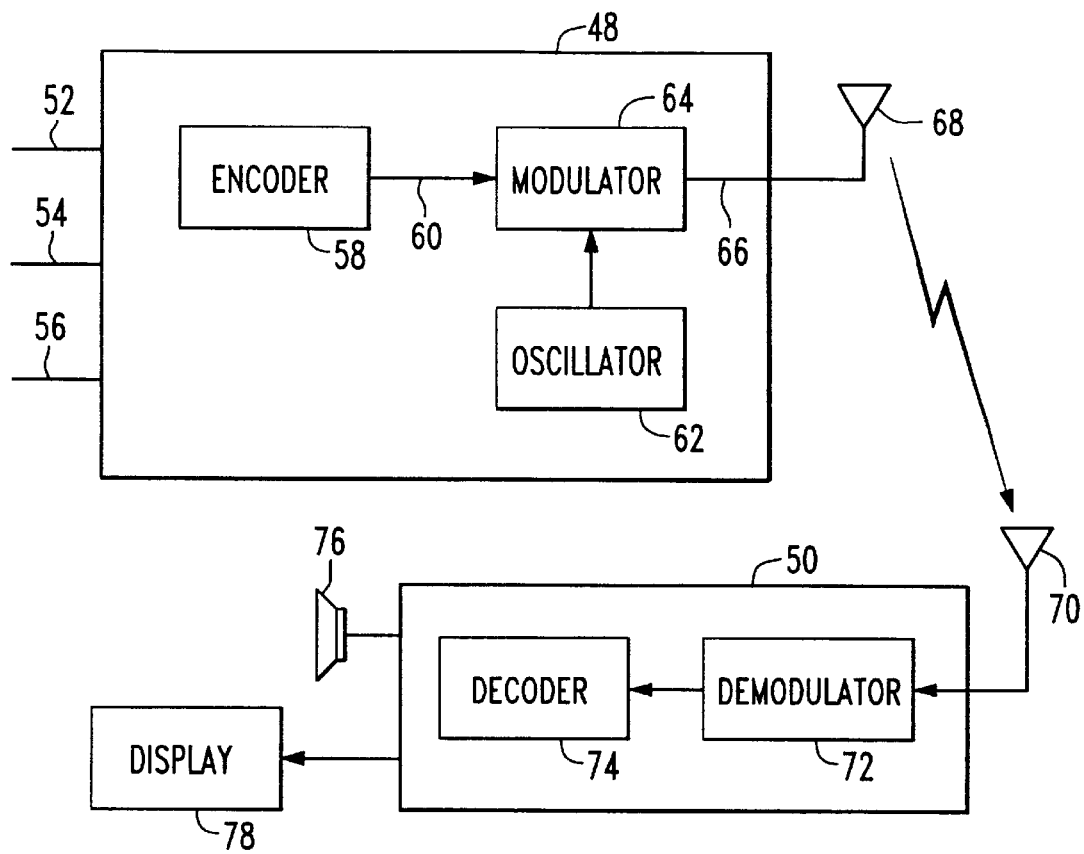
FIG. 3 is a simplified functional block diagram of a transmitter and receiver which operate in accordance with the method of the invention.

FIG. 3 is a simplified block diagram of a transmitter 48 and receiver 50. The transmitter receives program material, which may include, for example, stereo audio signals on lines 52 and 54 and data on line 56. The program material is encoded by encoder 58 to produce puncturable code on line 60. The puncturable code includes both non-puncturable bits and puncturable bits. A plurality of carriers are produced by oscillator 62 and these carriers are then modulated by the code bits by modulator 64 to produce an orthogonally frequency division multiplexed signal on line 66 which is transmitted by way of antenna 68 to the receiver. The receiver antenna 70 receives the OFDM carriers. Demodulator 72 extracts the code from the OFDM carriers and decoder 74 converts the code back to program material that may be delivered to an output device such as speaker 76 or display 78.

Figure 4:
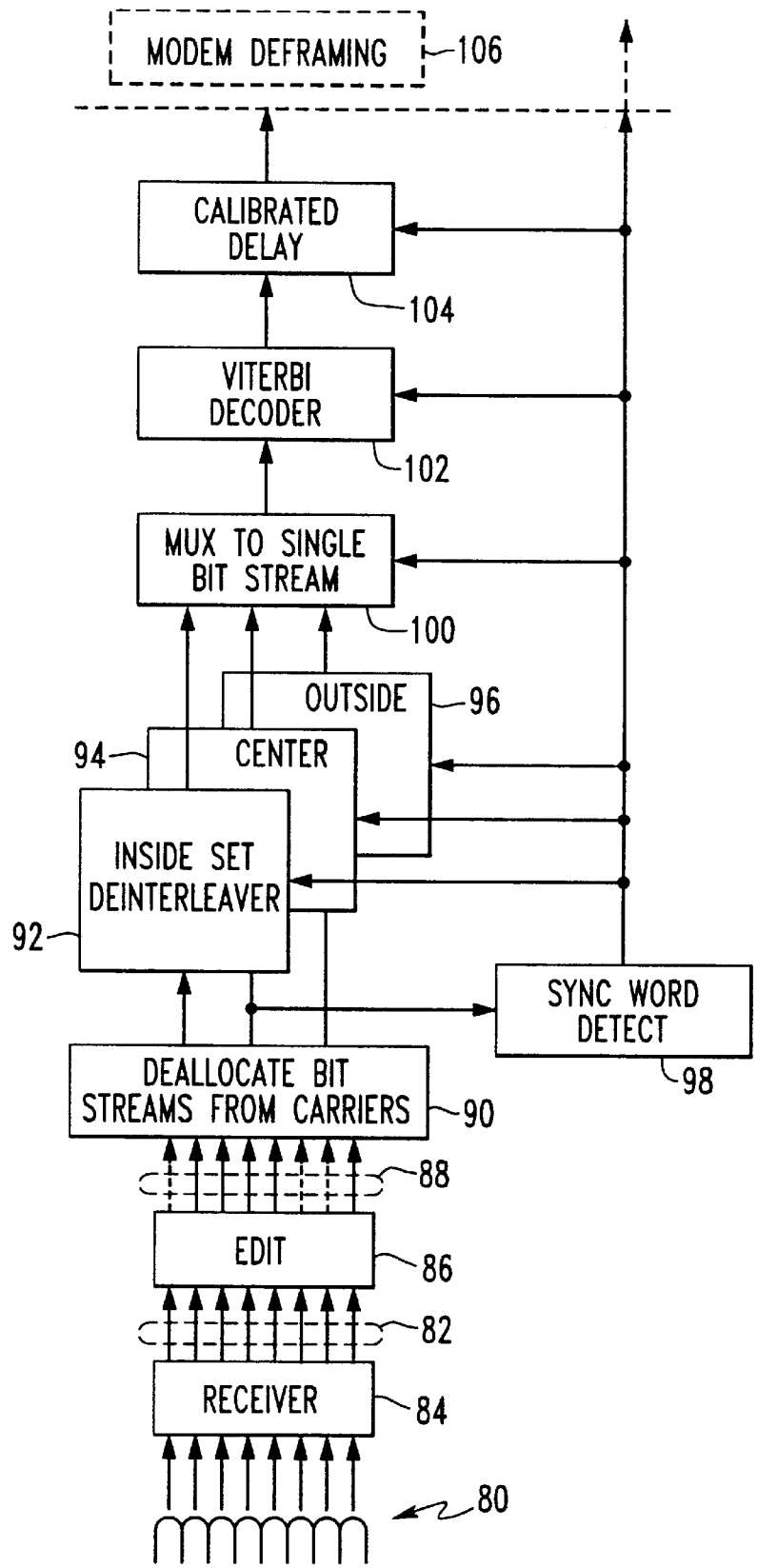
FIG. 4 is a functional block diagram showing the mapping and processing of bits through a receiver, deinterleaver, and forward error correction decoder.

FIG. 4 is a more detailed functional block diagram showing the mapping and processing of bits through a portion of a receiver that operates in accordance with the method of the invention. A plurality of OFDM carriers 80 are received and converted to bit streams on lines 82 by receiver circuit 84. Circuit 84 includes a digitizer, carrier synchronization, symbol synchronization, and matched filters all operating in accordance with well known techniques to produce the bit streams on line 82. Editor 86 detects the bits and erases certain puncturable bits (or reduces the weights of those bits) according to the interference level of the carriers used to transmit the bits, to produce edited bit streams on lines 88. Block 90 shows that the bit streams are deallocated from the carriers and delivered to several deinterleavers 92, 94 and 96. Block 98 shows that a sync word is allocated to the most reliable carriers. The outputs of the deinterleavers are multiplexed to a single bit stream as shown in block 100. A Viterbi decoder 102 decodes the single bit stream. A calibrated delay is added in block 104 to permit blending of the FM digital audio broadcast signal. The delayed signal is then passed to modem deframing block 106 for further processing. Soft-decision Viterbi decoding with (near) optimum soft-decision weighting for maximum ratio combining (MRC) for differentially detected QPSK sub-carrier symbols is employed to minimize losses over the channel.

A CPC code that can be used in this invention can be constructed by starting with an industry standard rate ⅓ convolutional code. A schematic representation of a rate ⅓ convolutional encoder is presented in FIG. 5. Shift register 108 receives input data bits on line 110. These input, data bits are received at a rate B and are representative of program material to be transmitted. Such program material may include, for example, audio information representative of talk or music signals, and/or data. Taps are used to direct the bits of information in the shift register to modulo 2 adders 112, 114 or 116. The taps chosen are for illustration only. A seven stage shift register with appropriate tapoff points would be used for a K=7, R=⅓ code. The output of the modulo 2 adders contains puncturable coded bits and non-puncturable bits. A switch 118 cycles at a rate 3B for a rate ⅓ code. This produces the coded output bits on line 120 at a bit rate of 3B.

Figure 5:
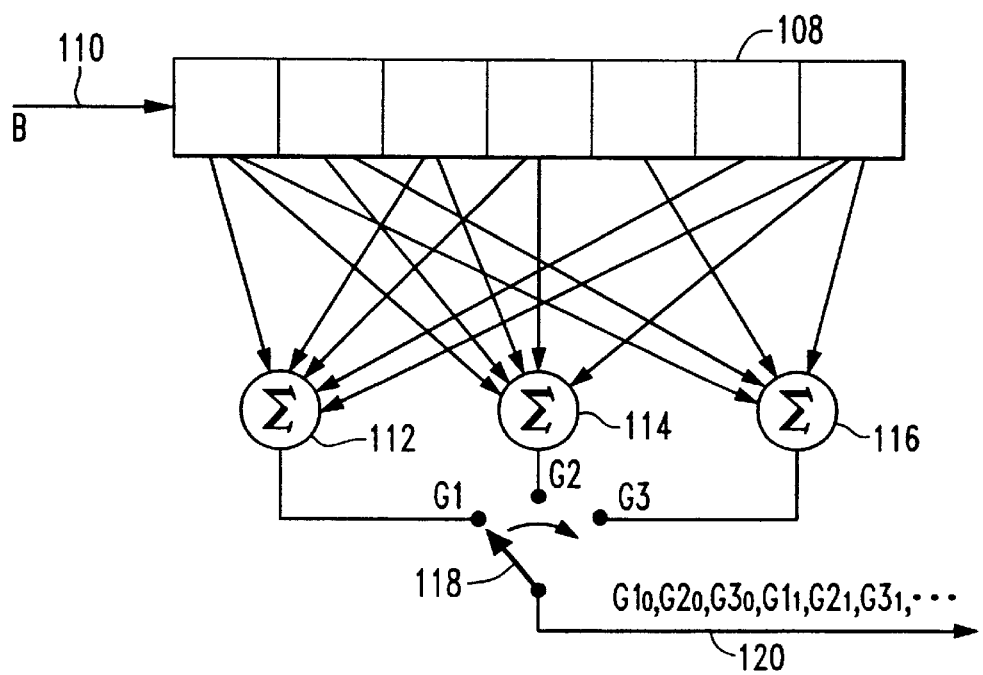
FIG. 5 is a schematic representation of a K=7, R=⅓ convolutional encoder.

The rate ⅓ convolutional encoder of FIG. 5 can be viewed as producing 3 encoded bit streams (G1, G2 and G3), each at the same rate as the input. The combination of these 3 bit streams produces the R=⅓ coded output sequence. To create a complementary code pair, for example, a subset of the output code bits is assigned to the lower DAB sideband and a different (complementary) subset is assigned to the upper sideband. Each subset must contain at least the same rate of bits as the information input rate, plus some additional bits to provide some coding gain.

The coded bit mask of a Puncture Pattern matrix is shown as:

$$\begin{bmatrix} G1_0 & G1_1 & G1_2 & G1_3 \\ G2_0 & G2_1 & G2_2 & G2_3 \\ G3_0 & G3_1 & G3_2 & G3_3 \end{bmatrix}$$

The Puncture Pattern matrix represents the encoder output symbols over each set of 4 information bits. Therefore the output symbols are identified and indexed modulo 4. A logic 1 in any of the 12 locations of the mask indicate that that particular bit is used. Otherwise, a logic zero indicates that the bit is not used.

This bit pattern may be chosen based on a known optimal R=⅘ puncture pattern, or from a RCPC code pattern. However, after one sideband is defined in this manner, there is little flexibility on choosing the bits for the opposite sideband since they should be chosen from the punctured (complementary) bits to achieve maximum coding gain when combined to form the base code. Fortunately, analysis and computer simulation have verified that good complementary codes do exist. For example the bit patterns shown above yield very good performance when G1=133, G2=171, and G3=165 where the generator connections are represented by standard octal notation.

A pair of complementary puncture patterns, one for the upper DAB sideband and one for the lower DAB sideband, can be shown as:

$$PPL = \begin{pmatrix} 0 & 1 & 1 & 0 \\ 1 & 0 & 0 & 1 \\ 0 & 0 & 1 & 0 \end{pmatrix} \quad PPU = \begin{pmatrix} 1 & 0 & 0 & 1 \\ 0 & 1 & 1 & 0 \\ 1 & 0 & 0 & 0 \end{pmatrix}$$

Individually, these Puncture Patterns define the pair of rate ⅘ codes. The pair of complementary rate ⅘ codes can be combined to form the rate ⅖ base code as shown below. Each of the rate ⅘ codes has a free distance of $d_f$=4 with information error weight $c_d$=10. The combined rate ⅖ code yields $d_f$=11 with $c_d$=8. Notice that only half the G3 bits are used in this CPC code. The puncture pattern for the original ⅖ code is:

$$PPL + PPU = \begin{pmatrix} 1 & 1 & 1 & 1 \\ 1 & 1 & 1 & 1 \\ 1 & 0 & 1 & 0 \end{pmatrix}$$

Optionally the punctured bits of the rate ⅖ code can be transmitted to yield a pair of rate ⅔ CPC codes with $d_f$=6, can be shown as:

$$PPLop := \begin{pmatrix} 0 & 1 & 1 & 0 \\ 1 & 0 & 0 & 1 \\ 0 & 1 & 1 & 0 \end{pmatrix} \quad PPUop := \begin{pmatrix} 1 & 0 & 0 & 1 \\ 0 & 1 & 1 & 0 \\ 1 & 0 & 0 & 1 \end{pmatrix}$$

Of course, the base code is the unpunctured rate ⅓ code with $d_f$=14. A rate ⅘ code on each sideband requires 25% additional bits. One method of allotting bits to the sidebands can be represented as:.

| Lower Sideband | Upper sideband |
|---|---|
| $G3_2$ $G2_0$ $G2_3$ $G1_1$ $G1_2$ | $G1_0$ $G1_3$ $G2_1$ $G2_2$ $G3_0$ |

The above representation shows the relative spectral locations of the coded bits. These spectral locations are maintained after interleaving by channelizing the interleaver into distinct partitions which are mapped to the appropriate sub-carriers on each sideband. The most expendable code bits are placed on the outer OFDM sub-carriers. The expendable bits contribute least to the free distance or coding gain of the combined code. The optional G3 bits can be placed on the inner carriers closest to the host FM spectrum. Analysis and simulation have demonstrated that this partitioned interleaver outperforms random interleaving under typical interference scenarios.

Figure 6A:
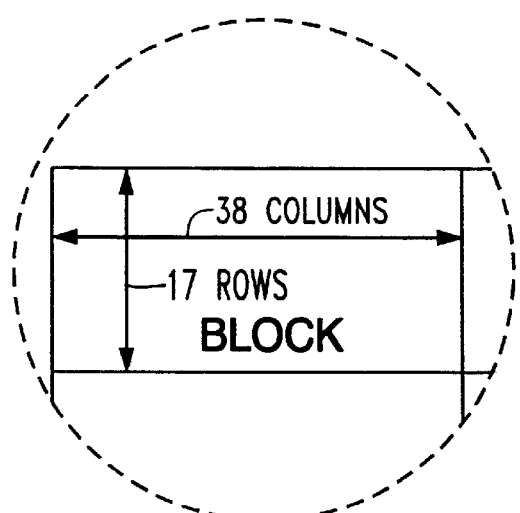
FIGS. 6 and 6a are schematic representations of an array of block codes which may be used in the invention.
Figure 6:
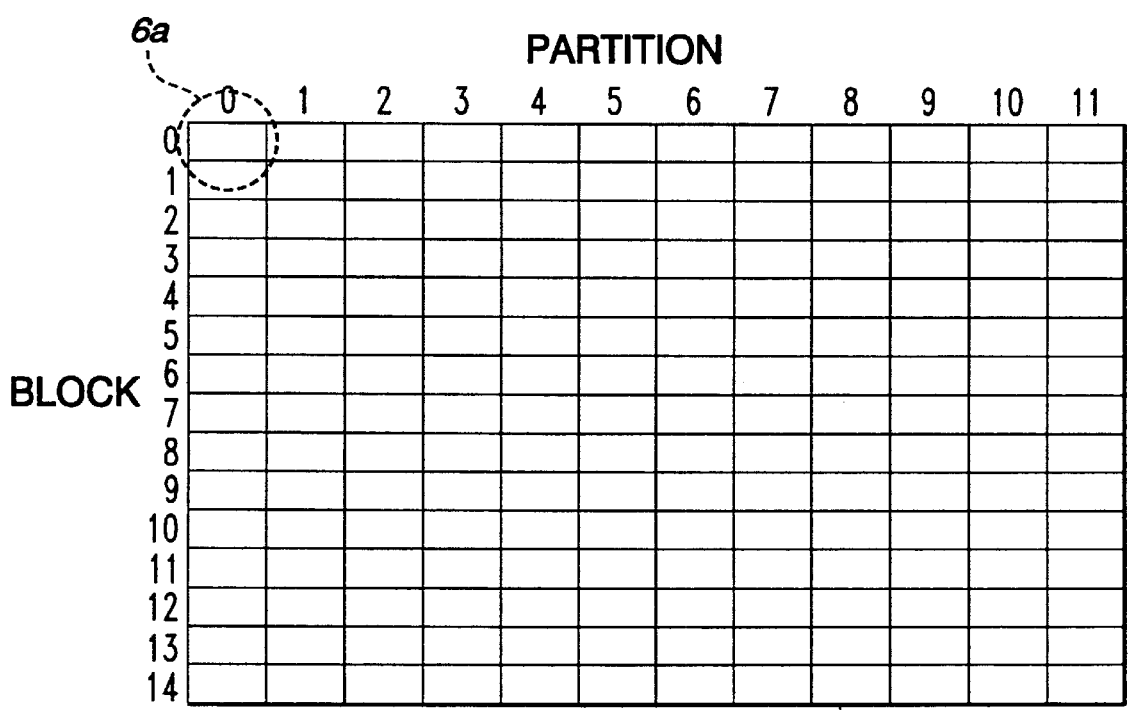

The use of CPC code techniques as well as interleaving over time can further inprove performance. A 255 row by 456 column interleaver array can be established to hold the bits produced by the convolutional encoder. A pictorial diagram of the interleaver array is presented in FIGS. 6 and 6a. Each row of the interleaver array 122 holds the code bits to be modulated in a parallel OFDM symbol. A $256^{th}$ row is reserved for the modem frame sync word. Each pair of columns is assigned to the in-phase and quadrature QPSK modulation of one of the 228 sub-carriers. Additional sub-carriers outside the interleaver may be used for transmission of the pilot or other data applications. Code bits are written into the interleaver array in a particular pattern. The array is read, row by row, providing the data source for the parallel OFDM symbols. The interleaver partition assignments can be shown as:

$$\text{partition\_assignment} = \begin{pmatrix} 7 & 3 & 4 & 8 \\ 1 & 9 & 10 & 2 \\ 11 & 6 & 0 & 5 \end{pmatrix}$$

$$\text{partitions} = (\,0\ \ 1\ \ 2\ \ 3\ \ 4\ \ 5\ \ \text{FM}\ \ 6\ \ 7\ \ 8\ \ 9\ \ 10\ \ 11\,)$$

The interleaver can be implemented by first assigning the code bits (modulo 12 index) of the puncture pattern to the 12 sub-carrier column partitions. This is illustrated in above using the partition index to identify the interleaver partitions corresponding to puncture pattern bits. The ordering ranges from 0 through 11 over the lower frequency sub-carriers to the higher frequency sub-carriers to represent the 12 sub-carrier partitions.

Each partition is comprised of 38 columns and carries code bits intended for 19 sub-carriers, where the real and imaginary components of a particular sub-carrier are identified as separate adjacent columns. The entire interleaver consisting of 12 partitions has 456 columns. The outermost sub-carriers are identified as columns 0, 1 and 454, 455. Columns 190 through 265 carry the optional punctured bits closest to the FM host spectrum. A portion of the interleaver array (rows 0 through 17, and columns 0 through 8) showing the spacings of the $k^{th}$ partition index can be shown as:.

$$\begin{bmatrix} 0 & 15 & 30 & 45 & 60 & 75 & 90 & 105 & 120 \\ 570 & 585 & 600 & 615 & 630 & 645 & 660 & 675 & 690 \\ 1140 & 1155 & 1170 & 1185 & 1200 & 1215 & 1230 & 1245 & 1260 \\ 1710 & 1725 & 1740 & 1755 & 1770 & 1785 & 1800 & 1815 & 1830 \\ 2280 & 2295 & 2310 & 2325 & 2340 & 2355 & 2370 & 2385 & 2400 \\ 2850 & 2865 & 2880 & 2895 & 2910 & 2925 & 2940 & 2955 & 2970 \\ 3420 & 3435 & 3450 & 3465 & 3480 & 3495 & 3510 & 3525 & 3540 \\ 3990 & 4005 & 4020 & 4035 & 4050 & 4065 & 4080 & 4095 & 4110 \\ 4560 & 4575 & 4590 & 4605 & 4620 & 4635 & 4650 & 4665 & 4680 \\ 5130 & 5145 & 5160 & 5175 & 5190 & 5205 & 5220 & 5235 & 5250 \\ 5700 & 5715 & 5730 & 5745 & 5760 & 5775 & 5790 & 5805 & 5820 \\ 6270 & 6285 & 6300 & 6315 & 6330 & 6345 & 6360 & 6375 & 6390 \\ 6840 & 6855 & 6870 & 6885 & 6900 & 6915 & 6930 & 6945 & 6960 \\ 7410 & 7425 & 7440 & 7455 & 7470 & 7485 & 7500 & 7515 & 7530 \\ 7980 & 7995 & 8010 & 8025 & 8040 & 8055 & 8070 & 8085 & 8100 \\ 8550 & 8565 & 8580 & 8595 & 8610 & 8625 & 8640 & 8655 & 8670 \\ 9120 & 9135 & 9150 & 9165 & 9180 & 9195 & 9210 & 9225 & 9240 \\ 1 & 16 & 31 & 46 & 61 & 76 & 91 & 106 & 121 \end{bmatrix}$$

Each partition is further divided into 15 blocks of 17 rows each. These blocks facilitate the interleaving over time by separating code bits, corresponding to adjacent coded information bits, by the number of rows in a block.

The interleaver array row and column indexes, row and col, respectively, are calculated using the following expressions.

$$col = \left[ \operatorname{int}\left(\frac{k}{BLOCKS}\right)\right] \mathrm{mod} COLS + 38 \cdot part,$$

$$row = \begin{bmatrix} \frac{ROWS}{BLOCKS} \cdot k + \\ \operatorname{int}\left(\frac{k}{COLS \cdot BLOCKS}\right) + \\ [(4 \cdot part) \bmod BLOCKS] \end{bmatrix} \mathrm{mod} ROWS,$$

where the interleaver size constants are ROWS=255, COLS=38, BLOCKS=15, and part is the partition (part =0, 1 , . . . 1) of the $kt^{th}$ puncture pattern. A portion of the interleaver array (FIG. 6) shows that consecutive values of the puncture pattern index k are spaced apart in both time and frequency.

This invention permits a receiver to mitigate the effects of interference from non-uniform interference in an orthogonal frequency division multiplex broadcast system. The preferred embodiment of the invention relates to an in-band on-channel (IBOC) digital audio broadcast (DAB) system where the outer OFDM sub-carriers furthest from the host FM carrier are sometimes subjected to destructive interference from the first adjacent and, possibly, the second adjacent channels. The technique described here allows the receiver to adaptively erase the soft symbols from particular OFDM carriers after it has determined that the interference is sufficiently high to corrupt them. The particular FEC coding technique employed here exploits the ability to puncture or erase particular bits without excessive loss in coding gain.

IBOC DAB is an ideal candidate for the application of CPC codes since the digital DAB transmission is accomplished over two sidebands (upper sideband and lower sideband) which are potentially impaired by nearly independent interferers with independent fading. If one sideband is completely corrupted by a strong first adjacent FM signal in the vicinity of the receiver, the opposite sideband must be independently decodable at the receiver. Therefore each sideband must be coded with an independently decodable FEC code. However, when both sidebands contain useful information that is not completely corrupted by an interferer, then CPC codes provide additional coding gain above that achieved by power combining the two sides. Furthermore, OFDM interleaving techniques have been developed to deal with the unique interference and selective fading characteristics of the FM IBOC DAB channel.

This invention exploits interleaving over time to mitigate the effects of flat (or wideband) fades over multiple symbol times, and exploits a priori knowledge of nonuniform sub-channel interference statistics. The latter has resulted in careful placement of the code bits over the sub-carriers, and the selection of the CPC codes for the FM hybrid IBOC DAB application.

While the present invention has been described in terms of what are at present believed to be its preferred embodiments, it will be apparent to those skilled in the art that various changes may be made to the embodiments described above without departing from the scope of the invention as set forth in the following claims.

What is claimed is:

1. A broadcasting method comprising the steps of:

encoding program material using codes including a first set of bits and a second set of bits, said first set of bits contributing a greater coding gain to said codes than said second set of bits;

modulating a plurality of orthogonal frequency division multiplexed carrier signals with said codes, whereby said first set of bits are carried by a first group of said carrier signals and said second set of bits are carried by a second group of carrier signals, said first group of carrier signals being less susceptible to interference than said second group of carrier signals;

broadcasting said carrier signals;

receiving said carrier signals;

estimating the interference to which the carrier signals in said second group of carrier signals have been subjected to determine if carrier signals in said second group have been corrupted;

erasing bits carried by any of said carrier signals which have been determined to be corrupted; and decoding bits of said codes that have not been erased.

2. A broadcasting method comprising the steps of:

encoding program material using codes including a first set of bits and a second set of bits, said first set of bits contributing a greater coding gain to said codes than said second set of bits;

modulating a plurality of orthogonal frequency division multiplexed carrier signals with said codes, whereby said first set of bits are carried by a first group of said carrier signals and said second set of bits are carried by a second group of carrier signals, said first group of carrier signals being less susceptible to interference than said second group of carrier signals;

broadcasting said carrier signals;

said plurality of orthogonal frequency division multiplexed carrier signals are positioned in upper and lower sidebands of a radio channel; and said codes comprise first and second complementary codes, said first complementary code being used to modulate said orthogonal frequency division multiplexed carrier signals in said upper sideband and said second complementary code being used to modulate said orthogonal frequency division multiplexed carrier signals in said lower sideband.

3. The method of claim 2, wherein said first and second complementary codes comprise puncturable convolutional codes.

4. The method of claim 2, wherein said second set of bits contains audio information and said first set of bits contains data.

5. The method of claim 2, wherein said codes are rate compatible convolutional codes.

6. The method of claim 2, wherein said codes are systematic convolutional codes.

7. A broadcasting method comprising the steps of:

encoding program material using codes including a first set of bits and a second set of bits, said first set of bits contributing a greater coding gain to said codes than said second set of bits;

modulating a plurality of orthogonal frequency division multiplexed carrier signals with said codes, whereby said first set of bits are carried by a first group of said carrier signals and said second set of bits are carried by a second group of carrier signals, said first group of carrier signals being less susceptible to interference than said second group of carrier signals;

broadcasting said carrier signals; and interleaving said codes among said carrier signals.

8. The method of claim 7, wherein said interleaving step comprises the step of:

partitioning said codes to produce partitioned codes; and mapping said partitioned codes to predetermined ones of said carrier signals.

9. The method of claim 8, the step of mapping said partitioned codes to predetermined ones of said carrier signals assigns bits of said second set of bits to carrier signals in said second group of carrier signals.

10. A broadcasting method comprising the steps of:

encoding program material using codes including a first set of bits and a second set of bits, said first set of bits contributing a greater coding gain to said codes than said second set of bits;

modulating a plurality of orthogonal frequency division multiplexed carrier signals with said codes, whereby said first set of bits are carried by a first group of said carrier signals and said second set of bits are carried by a second group of carrier signals, said first group of carrier signals being less susceptible to interference than said second group of carrier signals; and broadcasting said carrier signals;

wherein said carrier signals lie in a channel and the second group of carrier signals are positioned at frequencies farther from a center channel frequency than said first group of carrier signals.

11. A broadcasting method comprising the steps of:

encoding program material using codes including a first set of bits and a second set of bits, said first set of bits contributing a greater coding gain to said codes than said second set of bits;

modulating a plurality of orthogonal frequency division multiplexed carrier signals with said codes, whereby said first set of bits are carried by a first group of said carrier signals and said second set of bits are carried by a second group of carrier signals, said first group of carrier signals being less susceptible to interference than said second group of carrier signals;

broadcasting said carrier signals;

receiving said plurality of orthogonal frequency division multiplexed carrier signals;

determining if carrier signals in said second group have been corrupted;

weighting bits carried by any of said carrier signals which have been determined to be corrupted to produce weighted codes; and decoding said weighted codes.

12. The method of claim 11, wherein said step of determining if carrier signals in said second group have been corrupted comprises the step of:

determining a signal to noise ratio for said carrier signals; and wherein the step of weighting bits carried by any of said carrier signals which have been determined to be corrupted to produce weighted codes comprises the steps of:

weighting said bits in response to said signal to noise ratio.

13. A method for receiving a radio frequency signal comprising the steps of:

receiving a plurality of orthogonal frequency division multiplexed carrier signals with codes including a first set of bits and a second set of bits, said first set of bits contributing a greater coding gain to said codes than said second set of bits, wherein said first set of bits are carried by a first group of said carrier signals and said second set of bits are carried by a second group of said carrier signals, said first group of said carrier signals being less susceptible to interference than said second group of said carrier signals;

determining if carrier signals in said second group have been corrupted by estimating the interference to which the carrier signals in said second group of carrier signals have been subjected;

erasing bits carried by any of said carrier signals which have been determined to be corrupted; and decoding bits of said codes that have not been erased.

14. A method for receiving a radio frequency signal comprising the steps of:

receiving a plurality of orthogonal frequency division multiplexed carrier signals with codes including a first set of bits and a second set of bits, said first set of bits contributing a greater coding gain to said codes than said second set of bits, wherein said first set of bits are carried by a first group of said carrier signals and said second set of bits are carried by a second group of said carrier signals, said first group of said carrier signals being less susceptible to interference than said second group of said carrier signals;

determining if carrier signals in said second group have been corrupted based on a signal to noise ratio for said carrier signals;

weighting bits carried by any of said carrier signals which have been determined to be corrupted to produce weighted codes in response to said signal to noise ratio; and decoding said weighted codes.

15. A radio frequency transmitter comprising:

means for encoding program material using codes including a first set of bits and a second set of bits, said first set of bits contributing a greater coding gain to said codes than said second set of bits;

means for modulating a plurality of orthogonal frequency division multiplexed carrier signals with said codes, whereby said first set of bits are carried by a first group of said carrier signals and said second set of bits are carried by a second group of carrier signals, said first group of carrier signals being less susceptible to interference than said second group of carrier signals;

means for broadcasting said carrier signals;

means for interleaving said codes into partitions to produce partitioned codes; and means for mapping said partitioned codes to said plurality of orthogonal frequency division multiplexed carrier signals.

16. A radio frequency transmitter comprising:

an encoder for encoding program material using codes including a first set of bits and a second set of bits, said first set of bits contributing a greater coding gain to said codes than said second set of bits;

a modulator for modulating a plurality of orthogonal frequency division multiplexed carrier signals with said codes, whereby said first set of bits are carried by a first group of said carrier signals and said second set of bits are carried by a second group of carrier signals, said first group of carrier signals being less susceptible to interference than said second group of carrier signals;

an interleaver for interleaving said codes into partitions to produce partitioned codes, and for mapping said partitioned codes to said plurality of orthogonal frequency division multiplexed carrier signals; and an antenna for broadcasting said carrier signals.

17. A radio frequency receiver comprising:

means for receiving a plurality of orthogonal frequency division multiplexed carrier signals with codes containing a first set of bits and a second set of bits, said first set of bits contributing a greater coding gain to said codes than said second set of bits, wherein said first set of bits are carried by a first group of said carrier signals and said second set of bits are carried by a second group of carrier signals, said first group of carrier signals being less susceptible to interference than said second group of said carrier signals;

means for determining if carrier signals in said second group of said carrier signals have been corrupted based on a signal to noise ratio for said carrier signals;

means for erasing bits carried by any of said carrier signals which have been determined to be corrupted; and means for decoding bits of said codes that have not been erased.

18. A radio frequency receiver comprising:

an antenna for receiving a plurality of orthogonal frequency division multiplexed carrier signals with codes containing a first set of bits and a second set of bits, said first set of bits contributing a greater coding gain to said codes than said second set of bits, wherein said first set of bits are carried by a first group of said carrier signals and said second set of bits are carried by a second group of carrier signals, said first group of carrier signals being less susceptible to interference than said second group of said carrier signals;

an editor for determining if carrier signals in said second group of said carrier signals have been corrupted based on a signal to noise ratio for said carrier signals, and for erasing bits carried by any of said carrier signals which have been determined to be corrupted; and a decoder for decoding bits of said codes that have not been erased.

19. A radio frequency receiver comprising:

means for receiving a plurality of orthogonal frequency division multiplexed carrier signals with codes containing a first set of bits and a second set of bits, said first set of bits contributing a greater coding gain to said codes than said second set of bits, wherein said first set of bits are carried by a first group of said carrier signals and said second set of bits are carried by a second group of carrier signals, said first group of carrier signals being less susceptible to interference than said second group of said carrier signals;

means for determining if carrier signals in said second group have been corrupted based on a signal to noise ratio for said carrier signals;

means for weighting bits carried by any of said carrier signals which have been determined to be corrupted to produce weighted codes; and means for decoding said weighted codes.

20. A radio frequency receiver comprising:

an antenna for receiving a plurality of orthogonal frequency division multiplexed carrier signals with codes containing a first set of bits and a second set of bits, said first set of bits contributing a greater coding gain to said codes than said second set of bits, wherein said first set of bits are carried by a first group of said carrier signals and said second set of bits are carried by a second group of carrier signals, said first group of carrier signals being less susceptible to interference than said second group of said carrier signals;

an editor for determining if carrier signals in said second group have been corrupted based on a signal to noise ratio for said carrier signals, and for weighting bits carried by any of said carrier signals which have been determined to be corrupted to produce weighted codes; and a decoder for decoding said weighted codes.

21. A radio frequency broadcasting system comprising:

a transmitter including means for encoding program material using codes including a first set of bits and a second set of bits, said first set of bits contributing a greater coding gain to said codes than said second set of bits; means for modulating a plurality of orthogonal frequency division multiplexed carrier signals with said codes, whereby said first set of bits are carried by a first group of said carrier signals and said second set of bits are carried by a second group of carrier signals, said first group of carrier signals being less susceptible to interference than said second group of carrier signals; and means for broadcasting said carrier signals;

a receiver including means for receiving a plurality of orthogonal frequency division multiplexed carrier signals with codes containing a first set of bits and a second set of bits, said first set of bits contributing a greater coding gain to said codes than said second set of bits, wherein said first set of bits are carried by a first group of said carrier signals and said second set of bits are carried by a second group of carrier signals, said first group of carrier signals being less susceptible to interference than said second group of said carrier signals; means for determining if carrier signals in said second group of said carrier signals have been corrupted; means for erasing bits carried by any of said carrier signals which have been determined to be corrupted; and means for decoding bits of said codes that have not been erased;

means for interleaving said codes into partitions to produce partitioned codes; and means for mapping said partitioned codes to said plurality of orthogonal frequency division multiplexed carrier signals.

22. A radio frequency broadcasting system comprising:

a transmitter including an encoder for encoding program material using codes including a first set of bits and a second set of bits, said first set of bits contributing a greater coding gain to said codes than said second set of bits; a modulator for modulating a plurality of orthogonal frequency division multiplexed carrier signals with said codes, whereby said first set of bits are carried by a first group of said carrier signals and said second set of bits are carried by a second group of carrier signals, said first group of carrier signals being less susceptible to interference than said second group of carrier signals; and an antenna for broadcasting said carrier signals;

a receiver including an antenna for receiving a plurality of orthogonal frequency division multiplexed carrier signals with codes containing a first set of bits and a second set of bits, said first set of bits contributing a greater coding gain to said codes than said second set of bits, wherein said first set of bits are carried by a first group of said carrier signals and said second set of bits are carried by a second group of carrier signals, said first group of carrier signals being less susceptible to interference than said second group of said carrier signals; an editor for determining if carrier signals in said second group of said carrier signals have been corrupted, and for erasing bits carried by any of said carrier signals which have been determined to be corrupted; and a decoder for decoding bits of said codes that have not been erased; and an interleaver for interleaving said codes into partitions to produce partitioned codes, and for mapping said partitioned codes to said plurality of orthogonal frequency division multiplexed carrier signals.

23. A radio frequency broadcasting system comprising:

a transmitter including an encoder for encoding program material using codes including a first set of bits and a second set of bits, said first set of bits contributing a greater coding gain to said codes than said second set of bits; a modulator for modulating a plurality of orthogonal frequency division multiplexed carrier signals with said codes, whereby said first set of bits are carried by a first group of said carrier signals and said second set of bits are carried by a second group of carrier signals, said first group of carrier signals being less susceptible to interference than said second group of carrier signals; and an antenna for broadcasting said carrier signals; and a radio frequency receiver including an antenna for receiving a plurality of orthogonal frequency division multiplexed carrier signals with codes containing a first set of bits and a second set of bits, said first set of bits contributing a greater coding gain to said codes than said second set of bits, wherein said first set of bits are carried by a first group of said carrier signals and said second set of bits are carried by a second group of carrier signals, said first group of carrier signals being less susceptible to interference than said second group of said carrier signals; an editor for determining if carrier signals in said second group have been corrupted based on a signal to noise ratio for said carrier signals, and for weighting bits carried by any of said carrier signals which have been determined to be corrupted to produce weighted codes; and a decoder for decoding said weighted codes.

\* \* \* \* \*

UNITED STATES PATENT AND TRADEMARK OFFICE
CERTIFICATE OF CORRECTION

PATENT NO. : 6,345,377 B1
DATED : February 5, 2002
INVENTOR(S) : Brian William Kroeger, Roy Ronald Stehlik and Denise Maureen Cammarata It is certified that error appears in the above-identified patent and that said Letters Patent is hereby corrected as shown below:

Column 3,
Line 20, "he" should read -- the --.

Column 6,
Line 62, "These input, data" should read -- These input data --.

Column 9,
Line 54, "...1)" should read -- ...11) --.
Line 55, "$kt^{th}$" should read -- $k^{th}$ --.

Signed and Sealed this

Fifth Day of October, 2004

JON W. DUDAS
*Director of the United States Patent and Trademark Office*